(12) United States Patent
Takagi

(10) Patent No.: US 10,282,980 B2
(45) Date of Patent: May 7, 2019

(54) PUSH-BUTTON BOX

(71) Applicant: KOITO ELECTRIC INDUSTRIES, LTD., Shizuoka (JP)

(72) Inventor: Rika Takagi, Shizuoka (JP)

(73) Assignee: KOITO ELECTRIC INDUSTRIES, LTD., Shizuoka (JP)

( * ) Notice: Subject to any disclaimer, the term of this patent is extended or adjusted under 35 U.S.C. 154(b) by 0 days.

(21) Appl. No.: 15/576,918

(22) PCT Filed: May 24, 2016

(86) PCT No.: PCT/JP2016/065361
§ 371 (c)(1),
(2) Date: Nov. 27, 2017

(87) PCT Pub. No.: WO2016/194713
PCT Pub. Date: Dec. 8, 2016

(65) Prior Publication Data
US 2018/0151062 A1 May 31, 2018

(30) Foreign Application Priority Data
May 29, 2015 (JP) ................................. 2015-109899

(51) Int. Cl.
*G08G 1/07* (2006.01)
*H05K 5/02* (2006.01)
(Continued)

(52) U.S. Cl.
CPC .............. *G08G 1/005* (2013.01); *G08G 1/07* (2013.01); *H01H 13/52* (2013.01); *H03K 17/975* (2013.01); *H05K 5/0239* (2013.01)

(58) Field of Classification Search
CPC ..... G08G 1/005; H03K 17/975; H05K 5/0239
See application file for complete search history.

(56) References Cited

U.S. PATENT DOCUMENTS 3,451,580 A * 6/1969 Husby .................... A62C 13/78
220/4.21
4,187,418 A * 2/1980 Harris ...................... H01H 9/02
174/45 R
(Continued)

FOREIGN PATENT DOCUMENTS

JP S51-124400 A 10/1976
JP 2005-135300 A 5/2005
(Continued)

OTHER PUBLICATIONS

International Search Report for PCT/JP2016/065361 by ISA/JP dated Aug. 2, 2016.

*Primary Examiner* — Joseph H Feild
*Assistant Examiner* — Rufus C Point
(74) *Attorney, Agent, or Firm* — Kubotera & Associates, LLC

(57) ABSTRACT

A push-button box that can enhance the waterproofness and the safety of the structure of the cabinet, and prevent a foreign matter from being left thereon, that enhances the operability of the push button, thereby being user friendly, and that is excellent in durability in operation and strength. In the push-button box 10 for instructing an operation of a pedestrian signal lamp device, a cabinet 11 that accommodates various components is formed of a base main body 20, which constitutes the rear face of the cabinet 11, being opened on the front face side, and a front case 30, which is combined with the base main body 20 so as to cover the opening thereof from forward, being provided with a push button 40, and in the state in which said front case 30 covers the opening of said base main body 20 from forward, the rear face thereof is opened downward in a diagonally rearward direction in the cabinet 11.

6 Claims, 12 Drawing Sheets

(51) Int. Cl.
*G08G 1/005* (2006.01)
*H01H 13/52* (2006.01)
*H03K 17/975* (2006.01)

(56) References Cited

U.S. PATENT DOCUMENTS

| | | | | |
|---|---|---|---|---|
| 4,757,920 | A * | 7/1988 | Harootian, Jr. | B67D 1/0869 220/4.22 |
| 4,821,905 | A * | 4/1989 | Hess | G01D 11/24 206/508 |
| 5,103,223 | A * | 4/1992 | Humphrey | A61F 9/08 340/407.1 |
| 5,477,942 | A * | 12/1995 | Shea | B66B 1/462 187/395 |
| 5,593,021 | A * | 1/1997 | Chwieralski | H01H 9/02 200/293 |
| 5,920,050 | A * | 7/1999 | Tolman | H01H 9/18 200/302.2 |
| 6,340,936 | B1 * | 1/2002 | McGaffey | G08G 1/005 340/407.1 |
| 6,466,140 | B1 * | 10/2002 | McGaffey | H03K 17/964 200/302.2 |
| 6,635,833 | B2 * | 10/2003 | Vignaud | H01H 21/28 200/293 |
| 6,982,630 | B2 * | 1/2006 | Beckwith | G08G 1/005 340/384.1 |
| 7,601,928 | B1 * | 10/2009 | Magness | H01H 13/52 200/341 |
| 10,026,312 | B1 * | 7/2018 | George | G08G 1/07 |
| 2005/0128105 | A1 * | 6/2005 | Green | B29C 39/10 340/944 |
| 2010/0026520 | A1 * | 2/2010 | Witte | G08G 1/07 340/908 |
| 2011/0140923 | A1 * | 6/2011 | Keller | G09F 27/00 340/944 |
| 2016/0210849 | A1 * | 7/2016 | Stussi | G08G 1/005 |

FOREIGN PATENT DOCUMENTS

| | | |
|---|---|---|
| JP | 2010-212101 A | 9/2010 |
| JP | 1514909 S | 1/2015 |
| JP | 1518469 S | 3/2015 |

* cited by examiner (a)

(b)

(c)

(d)

(a)

(b)

PUSH-BUTTON BOX

BACKGROUND OF THE INVENTION

Field of the Invention

The present invention relates to a push-button box that is provided as a piece of ancillary equipment for a pedestrian signal lamp device installed at an intersection or the like of a general road, and is used for instructing an operation (for example, lighting color change) of the pedestrian signal lamp device.

Description of the Related Art

Conventionally, for a pedestrian signal lamp device installed at an intersection of a general road or the like, a push-button box for instructing a change of the lighting color is often installed for convenience of the pedestrian. The push-button box is fixed to an appropriate support, such as a telegraph pole or the like, close to the intersection, and on the cabinet front face of the push-button box, there is disposed a push button for instructing a change to green when the lighting color of the pedestrian signal lamp device is red.

As shown in FIG. 20, a conventional push-button box 1 is configured as that of so-called front face opening type, using a box-shaped cabinet 2 that is largely opened on the front face side, and a flat plate-like lid 3 that closes such front face opening of the cabinet 2 from the inside thereof. The cabinet 2 provides a cubic geometry as a whole, and on the lid 3, there is disposed a push button 4. In addition, the cabinet 2 is fixed to a telegraph pole or the like in the state in which the top face and the bottom face of the cabinet 2 are horizontal, and the rear face and both side faces thereof and the lid 3 are vertical. On the rear face or the bottom face of the cabinet 2, there are provided a mounting fitting, piping or the like for use in fixing the cabinet 2 to a telegraph pole or the like. In addition, as a measure for waterproofing, the top face of the cabinet 2 is provided with an eaves-shaped protruding part 5, which is formed by extending the front end of the top face forward beyond the front face of the lid 3.

With such a conventional push-button box 1, there have been presented the following problems. In other words, there has been the possibility that, since the protruding part 5 is protruded forward beyond the front face of the lid 3, a pedestrian may be injured when he or she is in contact with the protruding part 5. In addition, with the protruding part 5 being contacted with pedestrians or exposed to wind and rain, there has been presented a problem that, in particular, the coating is easy to peel off, involving occurrence of rust. In addition, since the top face of the cabinet 2 is provided as a flat horizontal surface, there has been caused a problem that a foreign matter, such as dirt and dust, is often left thereon. Further, there has been the possibility that, when a visually handicapped person or the like tries to operate the push-button box 1 by grope, the location of the push button 4 may be difficult to be found by grope, thereby the push-button box 1 being not only non-user-friendly, but also the hand being get dirty or injured.

Then, in view of the problems as described above that the conventional push-button box 1 has presented, the applicant of the claimed invention has already proposed push-button boxes of a new design that have been disclosed in, for example, the Patent Document 1 and 2. These are registered designs, having a structure in which the front case is combined with the base main body such that the former is covered on the latter obliquely from above in order to prevent rainwater or the like from getting into the inside from above through the joints of these. In addition, the edges at the periphery of the opening of the base main body are all covered with the front face cover in order to prevent an injury and a rust from being caused.

Patent Document 1: Japanese Design Registration No. 1514909

Patent Document 2: Japanese Design Registration No. 1518469

SUMMARY OF THE INVENTION

However, the pieces of prior art as disclosed in the above Patent Documents 1 and 2 are related only to the application for registration of the design, and only from the written application and the drawings attached, even a person skilled in the art, if taking the common general technical knowledge into account, may be difficult to clearly grasp the technical features of the present designs that have been provided in order to solve the above problems.

In addition, the pieces of prior art as disclosed in the Patent Documents 1 and 2 provide nothing about operation of the push button, and have presented problems that the push button is non-user-friendly especially when a visually handicapped person or the like tries to operate it by grope, and has a vulnerable structure, thereby being easy to be broken, as with the push button 4 in the conventional general push-button box 1. Further, there has been another problem that the speaker accommodated inside the cabinet is generally disposed on the control board, and thus it is difficult not only to secure the necessary space on the control board, which is limited in area, but also to obtain a prescribed sound pressure.

The present invention has been made in view of the above problems that have been presented by the pieces of prior art, and is intended to provide a push-button box that can enhance the waterproofness and the safety of the structure of the cabinet, and prevent a foreign matter from being left thereon, that enhances the operability of the push button, thereby being user friendly, that is excellent in durability in operation and strength, and that allows easy mounting of the speaker and securing the sound pressure with ease, thereby having not only a design value, but also a high technical value as a product.

The subject matters of the present invention to achieve the above intention are disclosed in the following respective aspects of the present invention:

[1] A push-button box for instructing an operation of a pedestrian signal lamp device, including a cabinet that accommodates various components, the cabinet being formed of a base main body, which constitutes the rear face of the cabinet, being opened on the front face side, and a front case, which is combined with the base main body so as to cover the opening of the base main body from forward, being provided with a push button, in the state in which the front case covers the opening of the base main body from forward, the rear face of the front case being opened downward in a diagonally rearward direction in the cabinet.

[2] The push-button box according to [1], wherein the joint between an edge at the periphery of the opening of the base main body that extends on the top end side thereof and an edge at the periphery of the opening of the front case that extends on the top end side thereof, covering the edge at the periphery of the opening of the base main body from forward, is disposed on a rear slanted face that is inclined downward in a diagonally rearward direction from a horizontal plane as at least a part of the top face part of the entire cabinet.

[3] The push-button box according to [2], wherein the front case has a front slanted face that is inclined downward in a diagonally forward direction from a horizontal plane as at least a part of the front face part thereof, and on the front slanted face, the push button is disposed.

[4] The push-button box according to [3], wherein, in the front face part of the front case, the front slanted face is formed on the upper half side of the front face part, while, on the lower half side of the front face part, a front vertical face is formed which is continued to the lower end of the front slanted face, being hung down therefrom, on the respective outer faces of the front slanted face and the front vertical face, the push button being disposed.

[5] The push-button box according to [1], [2], [3] or [4], wherein the push button is provided with an operation panel part, which is bulged like a step and spread in parallel with respect to the reference plane in a place where the push button is disposed on the outer face of the front case; a spacer made of a metal that is disposed inside of the operation panel part; and a capacitance sensor, which is disposed inside of the front case, being butted against a part of the spacer.

[6] The push-button box according to [1], [2], [3], [4] or [5], including a speaker, which outputs a voice about the operation of the pedestrian signal lamp device, wherein, in a place where the speaker is to be disposed on the inner face side of the front case, a mounting part is provided, and in the state in which the speaker is positioned on the mounting part, the speaker is fixed to the mounting part through a plate-like bracket, which covers the speaker from the rear face side.

[7] The push-button box according to [1], [2], [3], [4], [5] or [6], including a display part (50), which displays various pieces of information about the operation of the pedestrian signal lamp device, wherein the display part is capable of giving a display in synchronization with the operation of one or any one of a plurality of push buttons, and is disposed in the vicinity of the corresponding push button on the outer face side of the front case.

Next, the functions on the basis of the above-described respective aspects of the present invention will be explained.

With the push-button box (10) according to the above [1], the cabinet (11) thereof is formed of a base main body (20), which constitutes the rear face of the cabinet (11), being opened on the front face side, and a front case (30), which is combined with the base main body (20) so as to cover the opening of the base main body (20) from forward, being provided with a push button (40).

In this way, as the basic structure, there is provided a configuration (that of the rear face opening type) in which the front face side and the rear face side in the structure of the front face opening type that has been used with the cabinet (2) of the conventional push-button box (1) are inverted such that the front case (30) on the front face side on which the push button (40) is disposed covers the opening in the base main body (20) on the rear face side from forward. Herein, being adapted to the above-mentioned inversion, the front case (30) is formed in the shape of a box rather than a simple plate in order to cover the opening of the base main body (20) from forward.

Thereby, the edges at the periphery of the opening of the base main body 20 are concealed by the front case 30, and in addition, the edges at the periphery of the opening of the front case 30 are disposed on the rear face side where it will not be touched by hand normally; and on the front face side of the entire cabinet 11, the number of protrusions that are exposed to the outer face can be minimized. Therefore, occurrence of an injury of a pedestrian due to the exposure of the edges to the front face can be prevented, and in addition, there is no conventional eaves-shaped protruding part, whereby the possibility that peeling off of the coating and rusting may be initiated from such a portion can be eliminated.

In particular, the front case (30) covers the opening of the base main body (20) from forward, the rear face thereof being opened downward in a diagonally rearward direction in the cabinet (11). Thereby, it becomes difficult that rainwater or dirt and dust gets into the inside of the cabinet (11) from the joint where the edge at the periphery of the opening of the front case (30) is overlapped with that at the periphery of the opening of the base main body (20) and the area in the proximity thereof, whereby peeling off of the coating and rusting can be more reliably prevented.

With the push-button box (10) according to the above [2], the joint between an edge at the periphery of the opening that extends on the top end side of the base main body (20) and an edge at the periphery of the opening that extends on the top end side of the front case (30), covering the edge at the periphery of the opening of the base main body from forward is disposed on a rear slanted face (23a) that is inclined downward in a diagonally rearward direction from a horizontal plane as at least a part of the top face part of the entire cabinet (11). Thereby, although the joint is disposed in the top face part of the cabinet (11), it is located on the rear slanted face (23a), thereby the possibility that rainwater or dirt and dust may be accumulated along the joint being eliminated. Furthermore, the inclination of the rear slanted face (23a) makes it impossible to leave a foreign matter or the like thereupon.

With the push-button box (10) according to the above [3], the front case (30) has a front slanted face (31a) that is inclined downward in a diagonally forward direction from a horizontal plane as at least a part of the front face part (31) thereof, and on the front slanted face (31a), the push button (40A) is disposed. Thus, a visually handicapped person can touch the push button (40A) with no effort at a location to which he or she simply extends the hand, thereby the operability being improved.

With the push-button box (10) according to the above [4], in the front face part (31) of the front case (30), the front slanted face (31a) is formed on the upper half side of the front face part (31), while, on the lower half side of the front face part (31), a front vertical face (31b) is formed which is continued to the lower end of the front slanted face (31a), being hung down therefrom. Herein, on the outer face of both of the front slanted face (31a) and the front vertical face (31b), the push button (40) is disposed. For each of these two push buttons (40), a specific application can be designated; for example, since the front slanted face (31a) is provided at a location or in an orientation with which a visually handicapped person can easily touch the push-button box (10), the push button (40A) on this front slanted face (31a) can be designated for use by a visually handicapped person, while the push button (40B) on the front vertical face (31b) can be designated for use by a healthy person or an aged one.

With the push-button box (10) according to the above [5], the push button (40) is provided with an operation panel part (41), which is bulged like a step and spread in parallel with respect to the reference plane in a place where the push button (40) is disposed on the outer face of the front case (30); a spacer (43) made of a metal that is disposed inside of the operation panel part (41); and a capacitance sensor (45), which is disposed inside of the front case (30), being butted against a part of the spacer (43).

The push button (40) thus configured can be easily operated by a visually handicapped person or the like in a groping manner, and can provide an improved durability and strength, as compared to the conventional general push button with a mechanical structure that is operated by depression. The spacer (43) is preferably disposed inside of the operation panel part (41) and on the outer face side of the front case (30), and against the capacitance sensor (45), which is disposed inside of the front case (30), only a part thereof may be butted through a hole part (33), which is provided in the front case (30).

The push-button box (10) according to the above [6] includes a speaker (60), which outputs a voice about the operation of the pedestrian signal lamp device. In the cabinet (11), such speaker (60) is mounted on the inner face side of the front case (30), being not disposed on the control board, as with the conventional push-button box. In other words, in a place where the speaker (60) is to be disposed on the inner face side of the front case (30), a mounting part (36) is provided, and in the state in which the speaker (60) is positioned on the mounting part (36), the speaker (60) is fixed through a plate-like bracket (61), which covers the speaker (60) from the rear face side.

According to such a scheme of mounting the speaker (60), the dead space on the inner face side of the front case (30) can be utilized as a space for disposition, with the mounting operation being facilitated. In addition, the rear face of the speaker (60) is covered with a plate-like bracket (61) over the entire area thereof, whereby a sufficient sound pressure can be secured without the sound being allowed to leak to the rear face side (the inside of the cabinet (11)). The mounting part (36) is preferably molded integrally with the front case (30) at the time of molding the front case (30).

The push-button box (10) according to the above [7] includes a display part (50), which displays various pieces of information about the operation of the pedestrian signal lamp device. Such display part (50) is capable of giving a display in synchronization with the operation of one or any one of a plurality of push buttons (40), and is disposed in the vicinity of the corresponding push button (40) on the outer face side of the front case (30). Thereby the display by the display part (50) can be associated to the operation of a specific push button (40), and thus an unnecessary display can be omitted.

The push-button box according to the present invention can enhance the waterproofness and the safety of the structure of the cabinet, and prevent a foreign matter from being left thereon, enhancing the operability of the push button, thereby being user friendly, being excellent in durability in operation and strength, and allowing easy mounting of the speaker and securing the sound pressure with ease, thereby increasing not only the design value, but also the technical value.

DETAILED DESCRIPTION OF THE PREFERRED EMBODIMENT

Hereinbelow, an embodiment representing the present invention will be explained with reference to the drawings.

FIG. 1 to FIG. 19 show one embodiment of the present invention.

A push-button box 10 according to the present embodiment instructs an operation of a pedestrian signal lamp device. Herein the pedestrian signal lamp device is installed at both ends of a crosswalk or the like such that it serves as an ancillary facility for the respective signal light devices for vehicle (which are not shown) that are installed at an intersection or the like of a general road.

The push-button box 10 is used, being fixed to a support such as a telegraph pole, for each pedestrian signal lamp device. The specific operations, such as the lighting color change in the signal light device for vehicle and the pedestrian signal lamp device, and the selection of the timing thereof, are controlled according to a prescribed program that is stored in the traffic signal controller (not shown). In addition, a part of the functions of the push-button box 10 is also controlled according to a prescribed program that is stored in the traffic signal controller. The signal light device for vehicle, the pedestrian signal lamp device, and the push-button box 10 are connected to the traffic signal controller through the respective signal lines.

Figure 1:
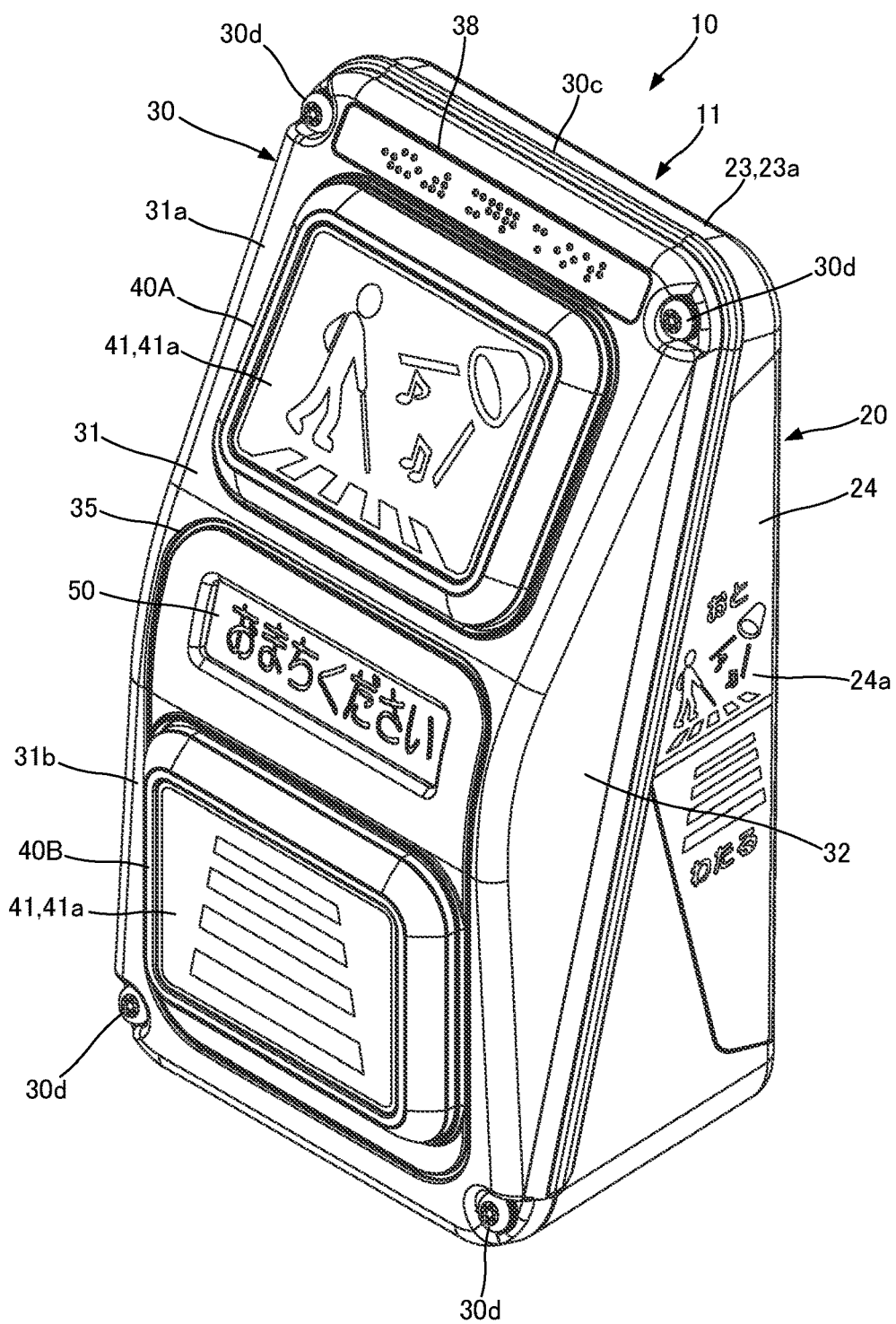
FIG. 1 is a perspective view of the push-button box according to an embodiment of the present invention.
Figure 2:
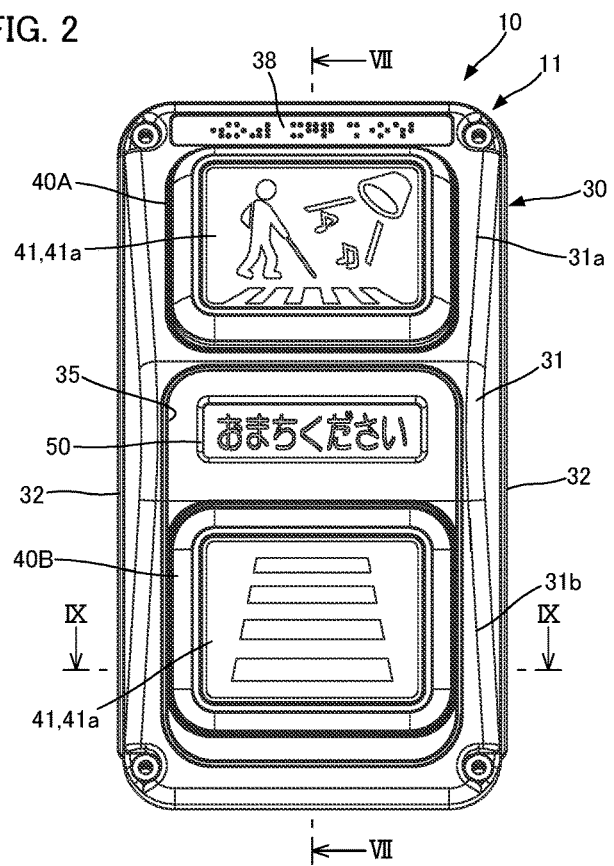
FIG. 2 is a front view of the push-button box according to an embodiment of the present invention.
Figure 3:
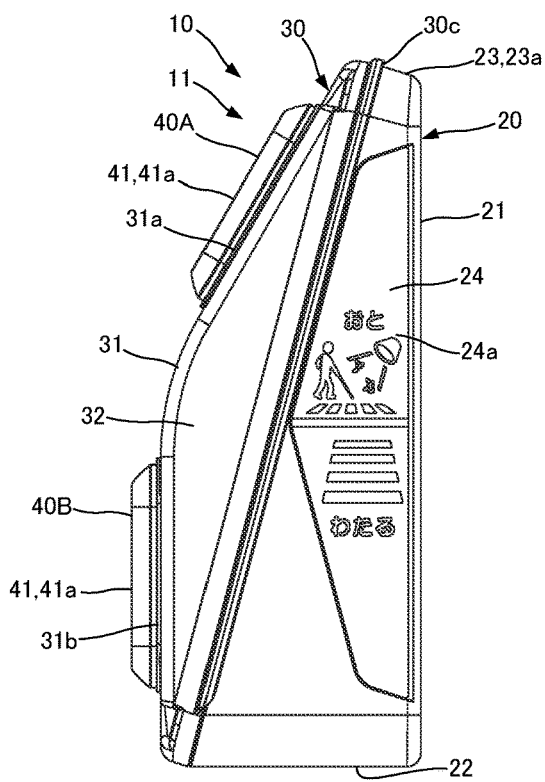
FIG. 3 is a right side view of the push-button box according to an embodiment of the present invention.
Figure 4:
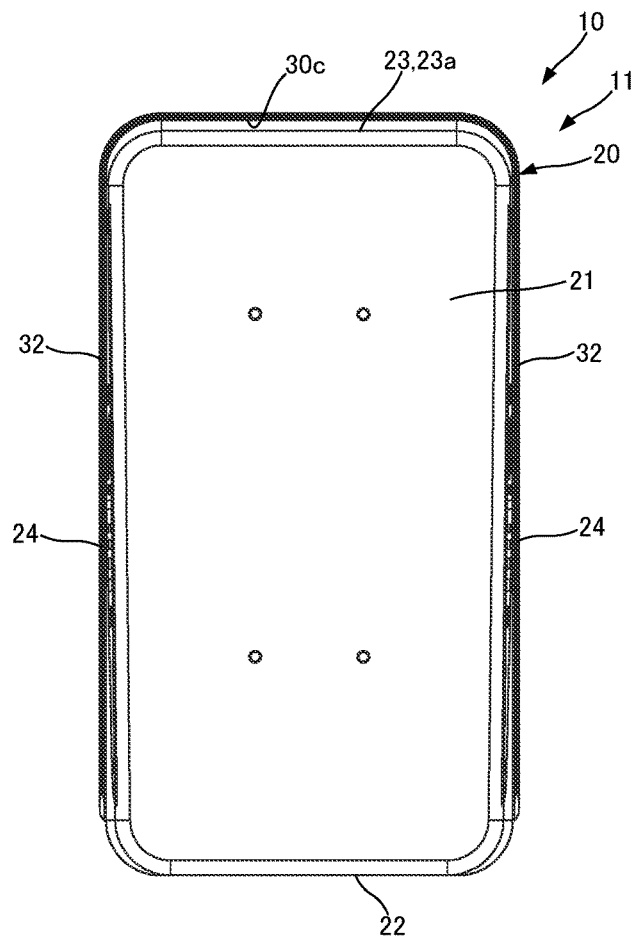
FIG. 4 is a rear view of the push-button box according to an embodiment of the present invention.
Figure 5:
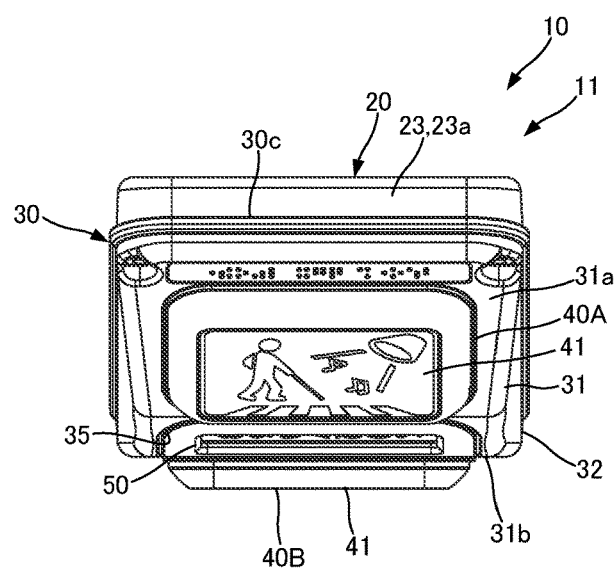
FIG. 5 is a plan view of the push-button box according to an embodiment of the present invention.
Figure 6:
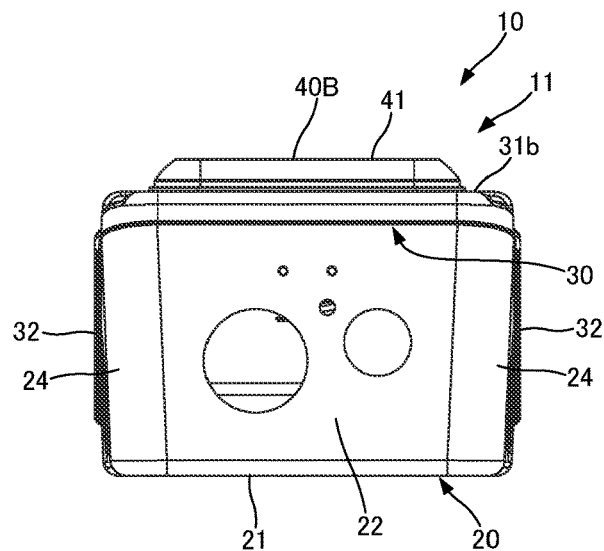
FIG. 6 is a bottom view of the push-button box according to an embodiment of the present invention.

As shown in FIG. 1, the push-button box 10 is provided with a cabinet 11 in the shape of a box that accommodates various components, such as electronic parts, and units of these. The cabinet 11 is formed of a base main body 20, which constitutes the rear face of the cabinet 11, being opened on the front face side, and a front case 30, which is combined with the base main body 20 so as to cover the opening of the base main body 20 from forward, being provided with a push button 40. In the present embodiment, there are provided two push buttons 40A and 40B in the upper and lower portions of the front case 30, and when it is needed to call them generically, they are expressed as the push button 40.

With the push-button box 10, by touching the push button 40, an operation of the pedestrian signal lamp device is instructed, however, the operation as mentioned here is not limited to the lighting color change (starting lighting up of the green color), and includes voice guiding and the like. In addition, as later described in detail, the push button 40 is not needed to be depressed for operation, since it is constituted by a capacitance sensor 45, which can be operated simply by touching it. Hereinbelow, the words "depressing" and "touching" are expressed simply as a word "operating" for convenience.

The base main body 20 is a shallow case-like member that is opened on the front face side, being integrally molded from any material that is excellent in strength, for example, a metallic material, such as aluminum or the like, and a resin material, such as an AAS resin or the like. In detail, the base main body 20 has a vertically long and rectangular rear face part 21, a horizontally long and rectangular bottom face part 22 that is extended forward from the lower end edge of the rear face part 21, a top face part 23 that is slightly extended diagonally upward from the upper end edge of the rear face part 21, and side face parts 24, 24 in the shape of a right triangle that surround these from a sidewise direction, being opened on the front face side thereof. Herein, the top face part 23 forms a major part of the top face part of the entire push-button box 10, the outer face thereof providing a rear slanted face 23a, which is inclined downward in a diagonally rearward direction from a horizontal plane.

The outer surfaces of the respective face parts of the base main body 20 are smooth and flat, having no protrusions, and the corners at which two or three faces are joined with one another are rounded in consideration of the safety. In addition, the push-button box 10 is fixed to a support, such as a telegraph pole, the rear face part 21 of the base main body 20 being provided with a band-like mounting fitting for fixing the push-button box 10 to the support at an appropriate level thereof in such a manner as an embracing one. The rear face part 21 is provided with screw holes for securing the mounting fitting. However, the specific method of mounting the push-button box 10 is not limited in particular. The location where the push-button box 10 is mounted is preferably set within the range of level at which the push-button box 10 can be easily operated by a person riding on a wheelchair or a child.

The front case 30 is a shallow lid-like member that is opened on the rear face side so as to cover the base main body 20, being aligned with each other by means of the edges at the periphery of the respective openings, and is integrally molded from the same material as that of the base main body 20. In detail, the front case 30 has a front face part 31 that constitutes the front face of the entire push-button box 10, and side face parts 32, 32 in the shape of a substantially isoceles triangle that surround the front face part 31 from a sidewise direction, the rear face side thereof being opened. Herein, the front face part 31 is formed as a front slanted face 31a, at least a part of which is inclined downward in a diagonally forward direction from a horizontal plane.

In detail, the upper half of the front face part 31 is formed as a front slanted face 31a, which is inclined downward in a diagonally forward direction from a horizontal plane, while the lower half thereof is formed as a front vertical face 31b, which is continued to the lower end of the front slanted face 31a, being hung down therefrom. The boundary portion between the front slanted face 31a and the front vertical face 31b is slowly curved, and the outer surfaces of the respective face parts of the front case 30 are smooth and flat, having no protrusions, and the corners at which two or three faces are joined with one another are rounded in consideration of the safety.

Figure 7:
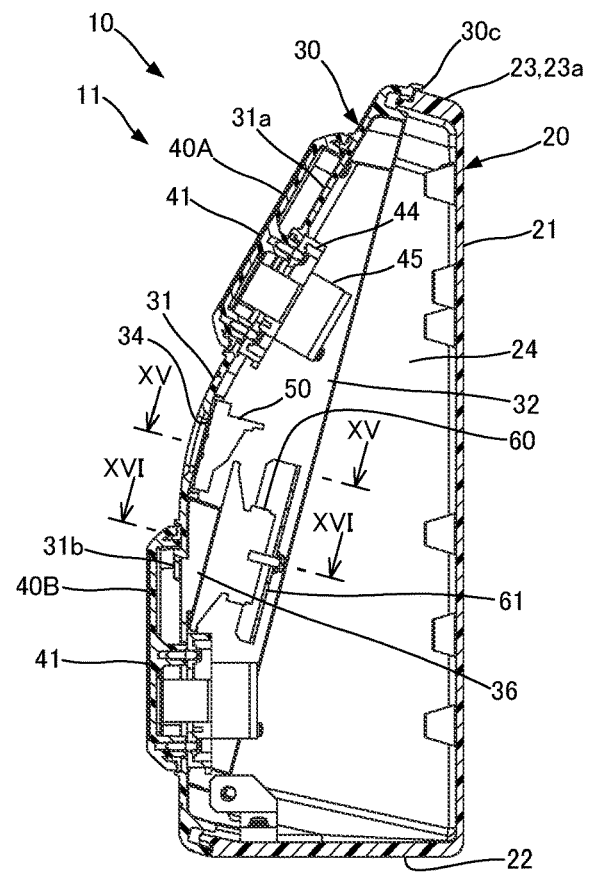
FIG. 7 is a sectional view along the line VII-VII in FIG. 2.

As shown in FIG. 7, the basic structure of the cabinet 11 provides a geometry (a rear-face opening type geometry) with which the front case 30 that is provided on the front face side thereof covers the opening of the base main body 20 from forward that is provided on the rear face side of the cabinet 11. In other words, the front case 30 is mounted to the base main body 20 so as to be joined therewith from diagonally upward. Herein, the joint between the edge at the periphery of the opening that is provided along the top face part 23 of the base main body 20 and the upper end edge of the front face part 31 of the front case 30 that covers the edge at the periphery of the opening of the base main body 20 from forward is disposed on the above-mentioned rear slanted face 23a, which is at least a part of the top face part of the entire cabinet 11.

Figure 8:
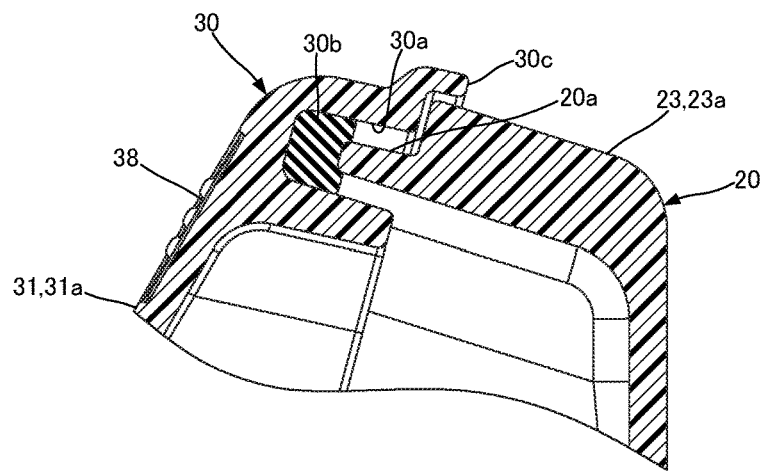
FIG. 8 is an enlarged partially sectional view of the top end part in FIG. 7.
Figure 9:
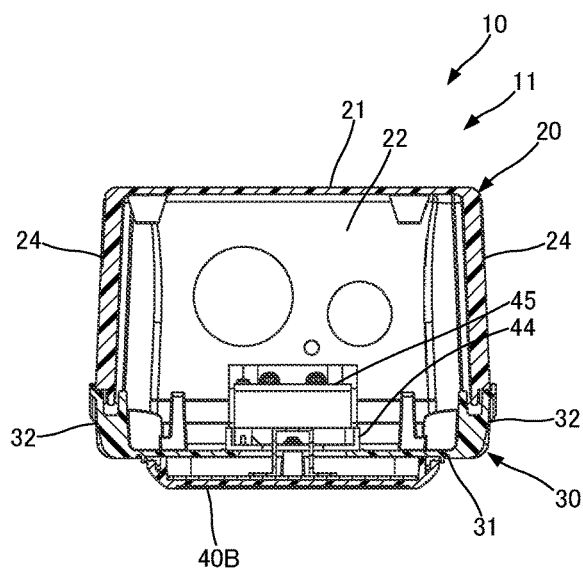
FIG. 9 is a sectional view along the line IX-IX in FIG. 2.
Figure 10:
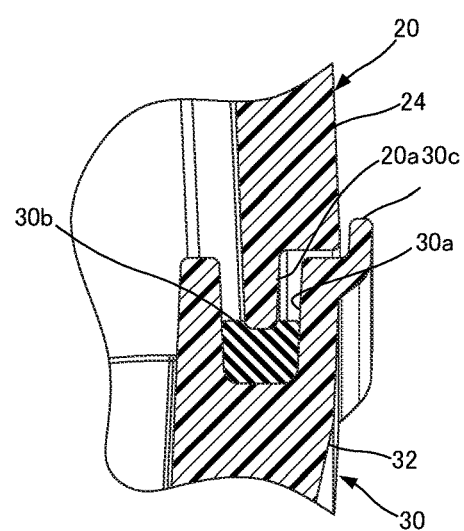
FIG. 10 is an enlarged partially sectional view of the right end part in FIG. 9.

In this way, the opening on the rear face side of the front case 30 is joined with the opening on the front face side of the base main body 20. In detail, as shown in FIG. 8 and FIG. 10, a convex part 20a that is extended as a projection is formed along the edges at the periphery of the opening of the base main body 20, while a concave part 30a that is extended along the edges at the periphery of the opening of the front case 30 like a groove is formed. Herein, the convex part 20a is engaged with the concave part 30a to be combined with each other. Into the bottom of the concave part 30a, an annular packing 30b formed of an elastic body is inserted, being pressed by the convex part 20a for enhancing the waterproofness. As a reverse configuration, a concave part may be provided for the base main body 20, while a convex part is provided for the front case 30.

As shown in FIG. 7 to FIG. 10, of the edges at the periphery of the opening of the front case 30, the upper end edge of the front face part 31 (that of the front slanted face 31a) and the rear end edge of the respective side face parts 32 are provided with a flange 30c, which not only joins with the edge at the periphery of the opening of the base main body 20, but also covers the edge at the periphery of the opening of the base main body 20 from above, thereby both edges being joined so as to overlap with each other. The end edge of such flange 30c actually provide a joint between the front case 30 and the base main body 20, and in particular, the flange 30c (the joint) along the upper end edge of the front face part 31 of the front case 30 is disposed on the rear slanted face 23a as described above. The flange 30c is not provided for the lower end edge of the front face part 31 (the front vertical face 31b thereof). In other words, the joint of the lower end edge of the edges at the periphery of the opening of the base main body 20 and that of the edges at the periphery of the opening of the front case 30 has no difference in level or edge.

In this way, the base main body 20 and the front case 30 are combined with each other to be screw-fastened, thereby the cabinet 11 of so-called rear face opening type being formed. In the internal cavity of the cabinet 11, various components, such as electronic parts, and units of these (a part of which is not shown) are accommodated. Screws 30*d*, which are for fixing the front case 30 to the base main body 20, are provided on the front face side of the front case 30 rather than on the top face side of the base main body 20. In detail, there are provided screw holes at the four corners of the front face part 31 of the front case 30, and at places that correspond to those screw holes in the edges at the periphery of the opening of the base main body 20, the same screw holes are also provided. As the screw 30*d*, which are to be screwed into these screw holes, it is preferable to use special screws for prevention of mischief that, unless a specialized tool is used, for example, are difficult to be removed.

Figure 11:
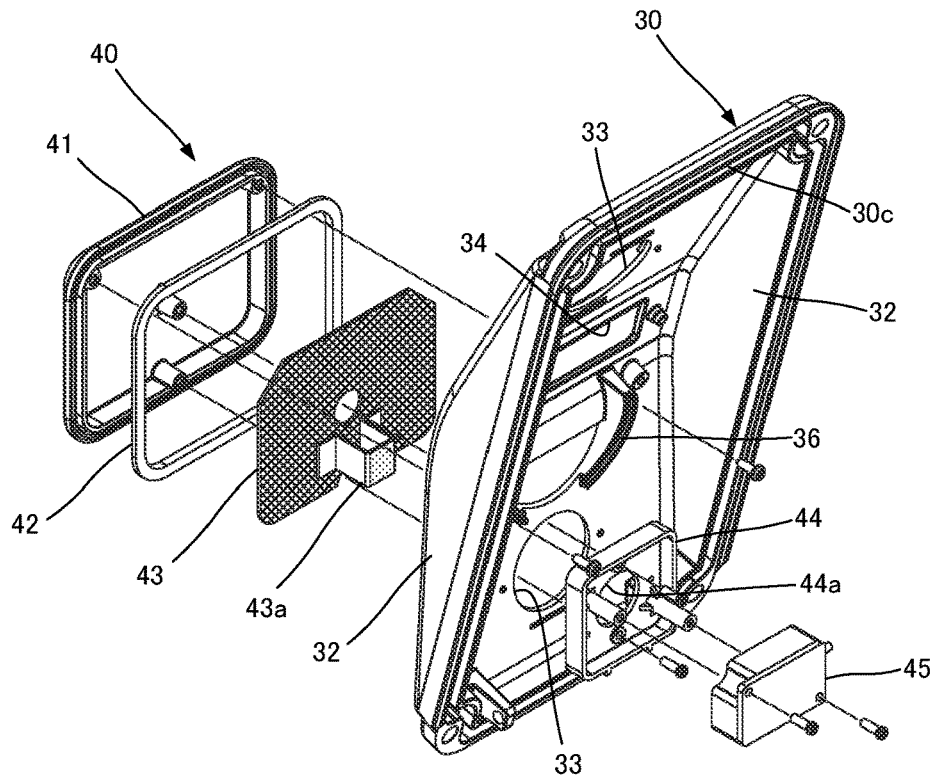
FIG. 11 is an exploded perspective view of a push button that is to be mounted to the front case of the push-button box according to an embodiment of the present invention.
Figure 12:
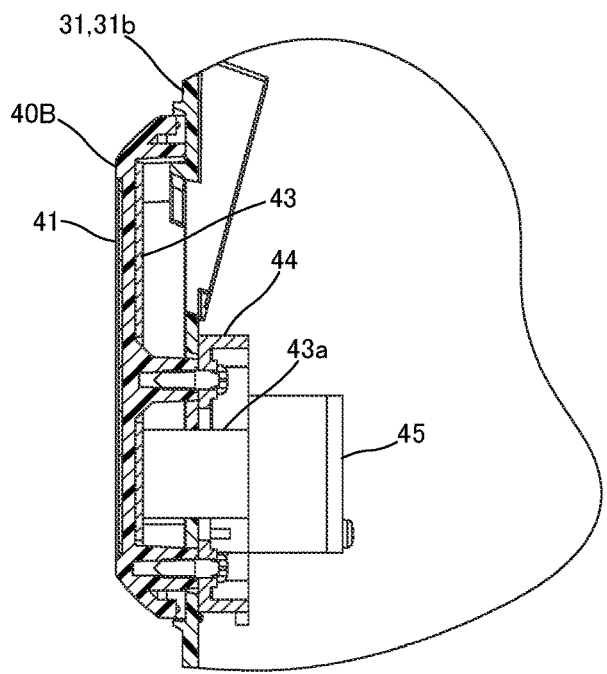
FIG. 12 is an enlarged partially sectional view of the lower area around the push button in FIG. 7.

The front face of the front case 30, in which the screw 30*d* is disposed, is provided with an inclination angle larger than that of the top face, being close to vertical, thereby being free from retention of water droplets, and thus water getting in the screw holes can be more reliably prevented. In addition, since the screws 30*d* can be tightened or removed from in front of the push-button box 10, using the tool, the support to which the push-button box 10 is fixed will not be a hindrance for work, whereby the front case 30 can be easily removed for checking the inside of the cabinet 10 and performing the maintenance thereof. As shown in FIG. 11, the concave part 30*a*, which is provided along the edges at the periphery of the opening of the front case 30 for fitting the packing 30*b* thereinto, is disposed so as to be located inside of the above-mentioned screw holes at the four corners thereof to thereby enhance the waterproofness.

As shown in FIG. 1, in the present embodiment, the front case 30 are provided with two push buttons 40A and 40B. One push button 40A is formed on the front slanted face 31*a*, which is on the upper half side of the front face part 31, while the other push button 40B is formed on the front vertical face 31*b*, which is on the lower half side of the front face part 31. Herein, since the front slanted face 31*a* is provided at a location or in an orientation with which a visually handicapped person can easily touch the push-button box 10, the push button 40A on this front slanted face 31*a* is designated for use by a visually handicapped person in particular. In addition, the push button 40B on the front vertical face 31*b* is designated for use by a healthy person or an aged one. The number of push buttons 40 is not particularly limited, and only one may be provided in either place, or two or more may be provided, regardless of the inclination of the front face part 31.

As shown in FIG. 7, in detail, the push button 40 is provided with an operation panel part 41, which is bulged like a step and spread in parallel with respect to the reference plane in a place where the push button 40 is disposed on the outer face of the front face part 31. The operation panel part 41 is spread in the shape of a rectangle with the edges at the periphery thereof forming a step that is rounded. The operation panel part 41 is disposed so as to cover a circular hole part 33 from the outer face side that is provided in the front slanted face 31*a* and the front vertical face 31*b* of the front face part 31, respectively, the rear of the operation panel part 41 being screw-fastened from the inner face side of the front face part 31. The operation panel part 41 is not mechanically movable, but is fixed to the outer face of the front face part 31 such that it will not be moved. Along the edges of the periphery of the operation panel part 41 on the rear side thereof, an annular packing 42 is loaded, being pressed against the outer face of the front face part 31 so as to enhance the waterproofness.

Inside of the operation panel part 41, there is provided a rectangular spacer 43 that is slightly smaller than the operation panel part 41. The spacer 43 is formed of a sheet material made of a metal, such as stainless steel or cast iron, and on the rear face side thereof, there is provided a step-like contact part 43*a*, which is passed through the above-mentioned hole part 33 to be protruded to the inner face side of the front face part 31. In addition, inside of the front face part 31, a capacitance sensor 45 is mounted through a supporting case 44, which is screw-fastened so as to surround the above-mentioned hole part 33.

The capacitance sensor 45 is a device that is turned on with the detection of a change in electrostatic capacitance of the electrode that is caused when a substance comes close to the detection electrode, and since it has a general configuration, the detailed explanation thereof will be omitted. Against the detection electrode of the capacitance sensor 45, the contact part 43*a* of the above-mentioned spacer 43 is butted. In other words, the spacer 43, which is made of a metal, widens the sensing region of the capacitance sensor 45. The contact part 43*a* of the spacer 43 is inserted through the hole part 33 of the front face part 31, and a hole part 44*a*, which is provided in the supporting case 44, being smaller than the hole part 33, however, since the hole part 44*a* is smaller in size than the entire capacitance sensor 45, there is no possibility that the sensor may be taken out to the outside through the hole part 44*a*.

On the flat surface of the operation panel part 41, a pictogram 41*a* is displayed which makes a guide for operation or suggests the subsequent action to be taken. As a specific design of the pictogram 41*a*, as shown in FIG. 1, in the pictogram 41*a* for the push button 40A on the upper side, a situation in which a visually handicapped person crosses a crosswalk while listening to a guiding sound from a later-described speaker 60 is expressed as a design mainly for the visually handicapped person. In addition, in the pictogram 41*a* for the push button 40B on the lower side, only a crosswalk is expressed mainly for the healthy person.

Also on the outer face of the respective side face parts 24 of the base main body 20, which are exposed to the outside, a side face seal 24*a*, which provides a pictogram, is affixed as required. Further, on the upper side of the push button 40A in the front face part 31 of the front case 30, a braille plate 38 for use by a visually handicapped person may be disposed.

As shown in FIG. 1, the front case 30 is provided with a display part 50, which displays various pieces of information about the operation of the pedestrian signal lamp device. The display part 50 is disposed along near the curved boundary between the front slanted face 31*a* and the front vertical face 31*b* in the front face part 31, and in that place, there is provided a horizontally long and rectangular opening part 34, which exposes the display face of the display part 50 to the outside. The display part 50 is fixed from the inner face side of the front face part 31 in the state in which the display face thereof is matched to the opening part 34. Herein, the specific type of the display part 50 is not limited in particular, and any type of display, such as the liquid crystal unit or the LED display, may be used, provided that various pieces of information, such as a character and a figure, can be displayed on the display face thereof.

The display part 50 corresponds to the lower push button 40B of the two push buttons 40, being not only disposed just above (in the proximity of) this push button 40B, but also accommodated in a frame 35 in which the push button 40B is also accommodated and which is formed with a thin groove on the outer face of the front face part 31, thereby the display part 50 and the push button 40B being more clearly associated to each other. In addition, by painting the inside of the frame 35 with a color different from that of the front case 30, the association between the display part 50 and the push button 40B may be still more clearly indicated. The display face in the display part 50 is inclined at the same angle as that of the joint between the front case 30 and the base main body 20 (the rear end edge of the side face part 32).

The various functions of the push-button box 10, including displaying of the display part 50, are controlled by a prescribed program stored in the control board that is accommodated in the inside of the cabinet 11, as well as the above-mentioned traffic signal controller. The control board is constituted by a microcomputer that is composed of general components, such as a CPU, an RAM, an ROM, and an interface, that are connected to the display part 50, and the electronic parts, such as the above-mentioned capacitance sensor 45 in the push button 40, and the later-described speaker 60, through the wiring.

In the present embodiment, the display part 50 corresponds to the lower push button 40B, and is controlled such that it gives a display only when this push button 40B is operated. In this way, the display part 50 is preferably capable of giving a display in synchronization with the operation of one or any one of a plurality of push buttons 40. As specific contents that are displayed by the display part 50, various pieces of information that are related to the operation of the pedestrian signal lamp device, such as a guiding word of "おまちください (Please wait)", which indicates that the push-button box 10 has been activated on the basis of the operation of the push button 40B can be mentioned.

The display part 50 is normally turned off or gives no display, but once the above-mentioned push button 40B is operated, it can display a guiding word, such as "おまちください (Please wait)", being lighted up for a while until the lighting color of the pedestrian signal lamp device is turned to green from red. As another example of piece of information that may be displayed, the waiting time for the pedestrian signal lamp device can be mentioned. In other words, it can be considered that, while the pedestrian signal lamp device remains red, the display part 50 displays the waiting time with a digital number that is calculated by subtracting the time at which the above-mentioned push button 40 has been operated from the time when the lighting color of the pedestrian signal lamp device will have been turned to green. As other examples of piece of information that may be displayed by the display part 50, the name of the present location, the current time, the weather forecast for the nearest possible future, a road guide (such as the name of a main building located in the direction of walking), and so forth can be mentioned.

In addition, the push-button box 10 has a speaker 60, which outputs a voice about the operation of the pedestrian signal lamp device. Conventionally, the speaker 60 has been disposed on the control board, however, with the push-button box 10 according to the present embodiment, the speaker 60 is disposed in the front case 30 rather than on the control board. In other words, as shown in FIG. 7, on the inner face side in a place in the front face part 31 of the front case 30 where the speaker 60 is to be disposed, there is provided a mounting part 36, which is protruded so as to surround the outer periphery of the speaker 60 from both sides thereof. Herein, the mounting part 36 is preferably molded integrally with the front case 30 at the time of molding the front case 30.

As shown in FIG. 13 to FIG. 16, in the state in which the speaker 60 is positioned on the mounting part 36 on the inner face side of the front face part 31, it is fixed to the mounting part 36 through a plate-like bracket 61, which covers the speaker 60 from the rear face side. In other words, the speaker 60 is screw-fastened in the state in which it is sandwiched between the mounting part 36 and the bracket 61 on the inner face side of the front face part 31. In addition, the bracket 61 is also separately screw-fastened on the inner face side of the front face part 31.

The speaker 60 is supported in the state in which a cone paper provided on the front face side thereof is separated from the inner face of the front face part 31 by the mounting part 36 in a slantwise inclined manner, and in a place in the front face part 31 where the cone paper is opposed thereto, there is provided a sound-passing small hole 37 for introducing the sound to the outside. This small hole 37 is disposed in a place where it is hidden behind the operation panel part 41 of the above-mentioned push button 40B. As the cone paper of the speaker 60, it is preferable to use a waterproof one. In addition, the bracket 61 is formed of a plate made of a metal, such as stainless steel or cast iron, and worked to a shape of a rectangle with an area large enough to cover the entire speaker 60 when viewed from the rear face thereof.

From such a speaker 60, in addition to a prescribed sound that, at the time of operation of the push button 40, tells it has been operated, or a voice message of "Please wait" being outputted, a prescribed sound telling that the push-button box 10 is for use by a visually handicapped person, or indicating the location of the push-button box 10 may be outputted at all times. Such a sound and voice from the speaker 60 are also controlled by a prescribed program stored in the control board accommodated in the cabinet 11 in addition to the above-mentioned traffic signal controller.

Figure 17:
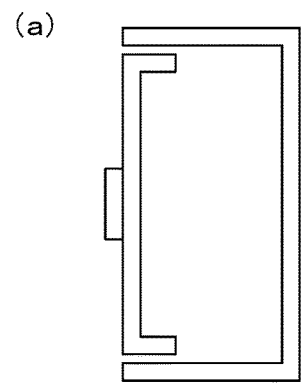
FIG. 17 is an explanatory drawing schematically illustrating how the design of the conventional push-button box has been improved to that of the push-button box 10 according to the present invention.
Figure 17:
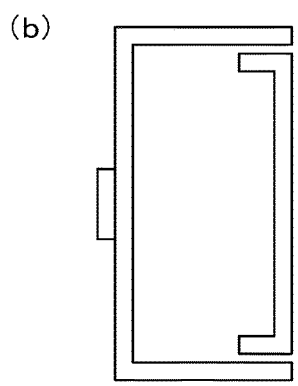
Figure 17:
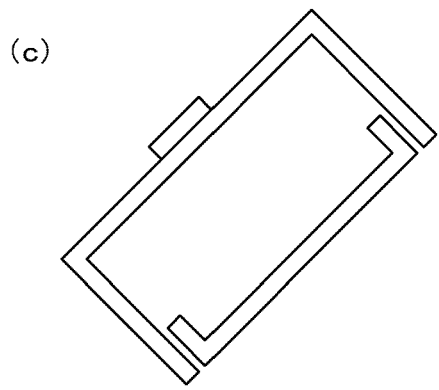
Figure 17:
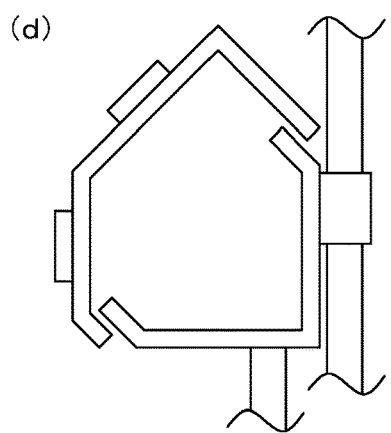
Figure 20:
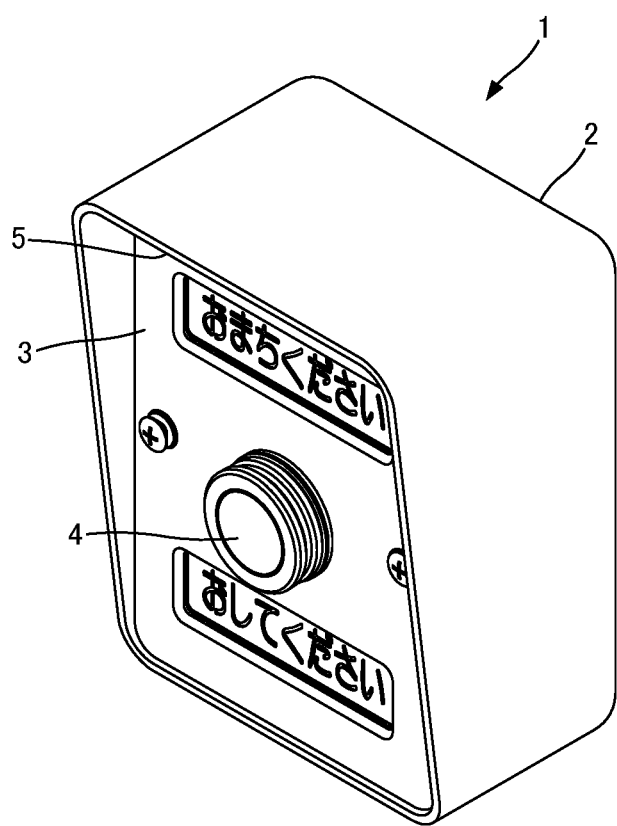
FIG. 20 is a perspective view of the conventional general push-button box.

FIG. 17 schematically illustrates how the design of the conventional push-button box has been improved to that of the push-button box 10 according to the present invention. FIG. 17(a) schematically depicts the conventional push-button box 1 shown in FIG. 20, which, as previously described, is configured as that of the so-called front face opening type, being provided with a box-shaped cabinet, which is largely opened on the front face side, and a flat plate-like lid, which covers the front face opening of the cabinet from the inside thereof. FIG. 17(b) depicts the basic structure of the so-called rear face opening type, in which the front face side and the rear face side in the structure of the front face opening type that is depicted in FIG. 17(a) are inverted such that the front case on the front face side on which the push button is disposed covers the opening in the base main body on the rear face side from forward.

The basic structure of the rear face opening type as depicted in FIG. 17(b) is the same as depicted in FIG. 17(a), adopting a vertically long and rectangular box shape as a basic geometry. In this way, by inverting the overlapping portions on the front face side and the rear face side of the cabinet, the edges at the periphery of the opening are all disposed on the rear face side. Therefore, occurrence of an injury of a pedestrian due to the exposure of the edges to the front face can be prevented, and in addition, there is no conventional eaves-shaped protruding part 5 (see FIG. 20), whereby the possibility of peeling off of the coating or rusting that may be initiated from such a portion can be eliminated.

In FIG. 17(c), in order to further improve the above-mentioned structure of the rear face opening type as depicted in FIG. 17(b) to provide a structure with which a foreign matter cannot be put on the top face part of the cabinet is provided, and in addition, to implement a better operability of a visually handicapped person, the cabinet itself is inclined, resulting in the face on which the push button is disposed (the operation face) being inclined downward in a diagonally forward direction from a horizontal plane. With such a structure or an installation posture, the front case covers the opening of the base main body from forward, the rear face thereof being opened downward in a diagonally rearward direction in the cabinet.

In FIG. 17(d), in order to still further improve the structure of the rear face opening type as depicted in FIG. 17(c), the design of the base main body is altered to provide a rear face and a bottom face in consideration of mounting the cabinet to a telegraph pole or the like, and that to a piping. In more detail, as depicted in the figure, the rear face of the base main body is provided with a vertical flat surface in consideration of mounting the cabinet to a telegraph pole or the like, and in addition, the bottom face of the base main body is provided with a horizontal flat surface in consideration of mounting the cabinet to a piping. In addition, the front case is bent in a vertical direction to allow the push button for a visually handicapped person to be disposed on the inclined face, whereby a plurality of push buttons can be installed without the convenience for a visually handicapped person being deteriorated.

Figure 18:
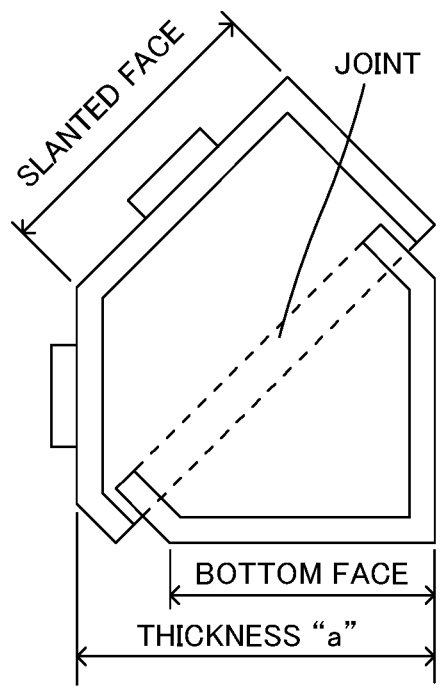
FIG. 18 is an explanatory drawing illustrating the reason why there is provided an inclined face at the joint of the front case and the base main body of the push-button box according to the present invention.
Figure 18:
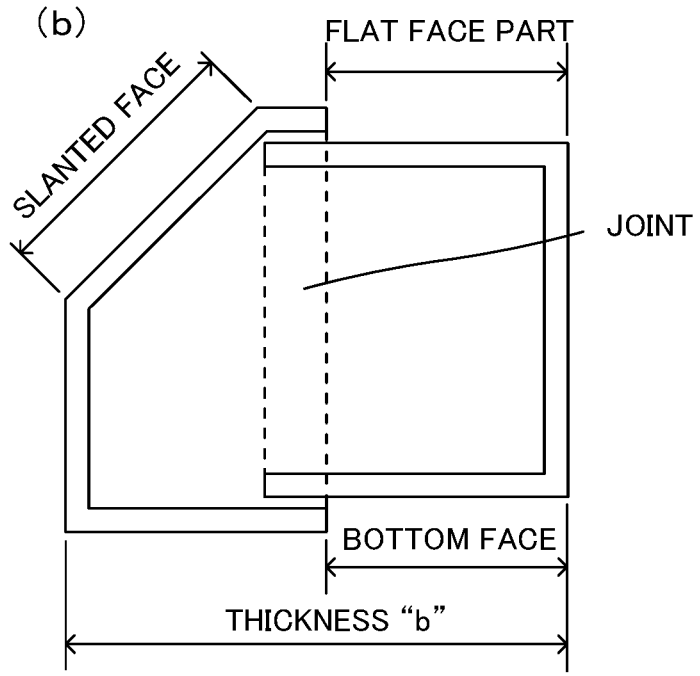

With the push-button box 10 according to the present embodiment, the entire cabinet 11 can be made thinner by inclining the joint of the base main body 20 and the front case 30. In detail, as shown in FIG. 18, in providing an inclined face for the front case, FIG. 18(a) illustrates a structure in which the joint of the base main body and the front case is inclined, while FIG. 18(b) illustrating a structure in which the joint is vertical.

As can be seen from the comparison between FIG. 18(a) and FIG. 18(b), in the case where the same inclined face and the same bottom face are to be provided, inclining the joint makes it possible to reduce the thickness of the entire cabinet. In other words, as illustrated in the figures, the inclined faces as given in FIG. 18(a) and FIG. 18(b) are identical in length and angle, and the bottom faces as given in FIG. 18(a) and FIG. 18(b) are also identical in length, however, the thickness "a" in FIG. 18(a) is made smaller than the thickness "b" in FIG. 18(b). In addition, FIG. 18(a), the flat face part as the top face in FIG. 18(b) has been eliminated.

Up to here, the configuration of the push-button box 10 has been described, and in addition, the reference matters for the push-button box 10 have been discussed, and next, the specific functions of the push-button box 10 according to the present embodiment will be explained.

As shown in FIG. 1 to FIG. 7, with the push-button box 10 according to the present embodiment, the cabinet 11 is formed of a base main body 20, which constitutes the rear face of the cabinet 11, being opened on the front face side, and a front case 30, which is combined with the base main body 20 so as to cover the opening thereof from forward, being provided with the push button 40.

According to such a structure of the rear face opening type, although the outline of the features thereof has already been explained, the edges at the periphery of the opening of the base main body 20 are concealed by the front case 30, and in addition, the edges at the periphery of the opening of the front case 30 are disposed on the rear face side where it will not be touched by hand normally; and on the front face side of the entire cabinet 11, the number of protrusions that are exposed to the outer face can be minimized. Therefore, occurrence of an injury of a pedestrian due to the exposure of the edges to the front face can be prevented, and in addition, there is no conventional eaves-shaped protruding part 5 (see FIG. 20), whereby the possibility that peeling off of the coating and rusting may be initiated from such a portion can be eliminated.

In particular, the front case 30 covers the opening of the base main body 20 from forward, the rear face thereof being opened downward in a diagonally rearward direction in the cabinet 11. Thereby, it becomes difficult that rainwater or dirt and dust gets into the inside of the cabinet 11 from the joint where the edge at the periphery of the opening of the front case 30 is overlapped with the edge at the periphery of the opening of the base main body 20 and the area in the proximity thereof, whereby peeling off of the coating and rusting can be more reliably prevented.

Furthermore, of the edges at the periphery of the opening of the front case 30, as shown in FIG. 7 to FIG. 10, the upper end edge of the front face part 31 (that of the front slanted face 31a) and the rear end edge of the respective side face parts 32 are provided with a flange 30c, which not only joins with the edge at the periphery of the opening of the base main body 20, but also covers the edge at the periphery of the opening of the base main body 20 from above, thereby both edges being joined so as to overlap with each other. Thereby, the waterproofness can be further enhanced, and in addition, such a mischief as using a flathead screwdriver or other tool to forcibly open can be prevented.

In addition, as shown also in FIG. 7 and FIG. 8, the above-mentioned flange 30c that provides a joint between the front case 30 and the base main body 20 is disposed, in particular, on the rear slanted face 23a, which is inclined downward in a diagonally rearward direction from a horizontal plane, as at least a part of the top face part of the entire cabinet 11. Thereby, although the joint is disposed in the top face part of the cabinet 11, it is located on the rear slanted face 23a, thereby the possibility that rainwater or dirt and dust may be accumulated along the joint being eliminated. Furthermore, the inclination of the rear slanted face 23a makes it impossible to leave a foreign matter or the like thereupon.

As shown in FIG. 1, in the front face part 31 of the front case 30, the front slanted face 31a is formed on the upper half side of the front case 30, while, on the lower half side of the front case 30, the front vertical face 31b is formed which is continued to the lower end of the front slanted face 31a, being hung down therefrom. Herein, since the front slanted face 31a is provided at a location or in an orientation with which a visually handicapped person can easily make an operation, the push button 40A for use by a visually handicapped person is provided on this front slanted face 31a. Thus, a visually handicapped person can touch the push button 40A just at a location to which he or she extends the hand, thereby the operability being improved.

On the other hand, on the front vertical face 31b, the push button 40B for use by a healthy person is provided. The push button 40B, being provided on the front vertical face 31b, is located particularly at a low level, whereby it can be easily operated even by a child or an aged person. In this way, each particular user can use any of the two push buttons 40A and 40B in a distinguishable manner. In addition, the joint of the base main body 20 and the front case 30 is inclined, whereby the entire cabinet 11 can be made thinner, and the freedom of design of the front case 30 is improved.

As shown in FIG. 7, either of the push buttons 40A and 40B is provided with an operation panel part 41, which is bulged like a step and spread in parallel with respect to the reference plane in a place where the push button is disposed on the outer face of the front case 30; a spacer 43 made of a metal that is disposed inside of the operation panel part 41; and a capacitance sensor 45, which is disposed inside of the front case 30, being butted against a part of the spacer 43. The push button 40 thus configured can be easily operated by a visually handicapped person or the like in a groping manner, and can provide an improved durability and strength, as compared to the conventional push button having a general structure. In addition, the conventional push button is generally configured with the sensor itself being covered, however, with the push button 40, the capacitance sensor 45 is provided inside of the cabinet 11, being not exposed to the outside, whereby the possibility that the push button 40 may be broken due to a mischief can be eliminated.

Although the capacitance sensor 45 is located inside of the cabinet 11, the detection electrode of the capacitance sensor 45 is butted against the contact part 43a of the spacer 43, being made of a metal, through the hole part 33 of the front face part 31. Herein, the spacer 43 is covered with the operation panel part 41, however, it is developed like a sheet above the outer face of the front face part 31, whereby it allows the sensor to be activated over a wider area than that of the detection electrode of the capacitance sensor 45.

With such an electrostatic capacitance type sensor, there is no possibility that the sensor may be freezed in a cold district, resulting in it becoming inoperative, as with the mechanical push button structure. In addition, the inside diameter of the hole part 33 of the front face part 31 and that of the hole part 44a of the supporting case 44, through which the contact part 43a of the spacer 43 is inserted toward the inside, are smaller than the entire size of the capacitance sensor 45, and therefore, even if the operation panel part 41 is removed, there is no possibility that the capacitance sensor 45 may be carried out to the outside through the hole parts 33 and 44a.

In addition, on the flat surface of the operation panel part 41, a pictogram 41a is displayed which makes a guide for operation or suggests the subsequent action to be taken. With such a pictogram 41a, the function at the time of operation of the push button 40 can be intuitively understood by anyone, since it is indicated with a unique pictogram, which expresses "man" and "function", rather than with a conventional symbol mark, which expresses "man" alone, or a wording.

The pictogram 41a may be directly printed on the surface of the operation panel part 41, however, if it is printed on such a metallic sheet as aluminum one, and is affixed thereto, the sensitivity of the capacitance sensor 45 can be further enhanced. The specific geometry of the operation panel part 41 is not limited to that as shown in the figure, which is rectangular, and it can be easily designed to a variety of geometries. In addition, the operation panel part 41 is a molding of synthetic resin, however, the respective push buttons 40 may be molded from resin materials having different colors, or coated with different colors.

When the push button 40 is actually operated, the capacitance sensor 45 detects it, outputting an ON signal to the traffic signal controller. Once the traffic signal controller receives the ON signal, the traffic signal controller changes the lighting color of the pedestrian signal lamp device from red to green after a prescribed time period having elapsed. In addition, the inside of the cabinet 11 controls the display of the display part 50 on the basis of the ON signal from the capacitance sensor 45 in the lower push button 40B. Once the operation of changing the lighting color of the pedestrian signal lamp device is completed, the display part 50 is returned to the state in which it is turned out or gives no display.

As described above, the display part 50 displays various pieces of information that are related to the operation of the pedestrian signal lamp device, such as a guiding word of "Please wait", which indicates that the push-button box 10 has been brought into an activated state on the basis of the operation of the push button 40B. Herein, as the supported language about the character information, preferably not only Japanese, but also a plurality of other languages, such as English and Chinese, are used, and the character information in these languages is previously stored in the ROM in the control board. In addition, as described above, the display part 50 is capable of giving a display in synchronization with the operation of one or any one of a plurality of push buttons 40, whereby the display by the display part 50 can be associated to the operation of a specific push button 40, and thus an unnecessary display can be omitted.

Figure 13:
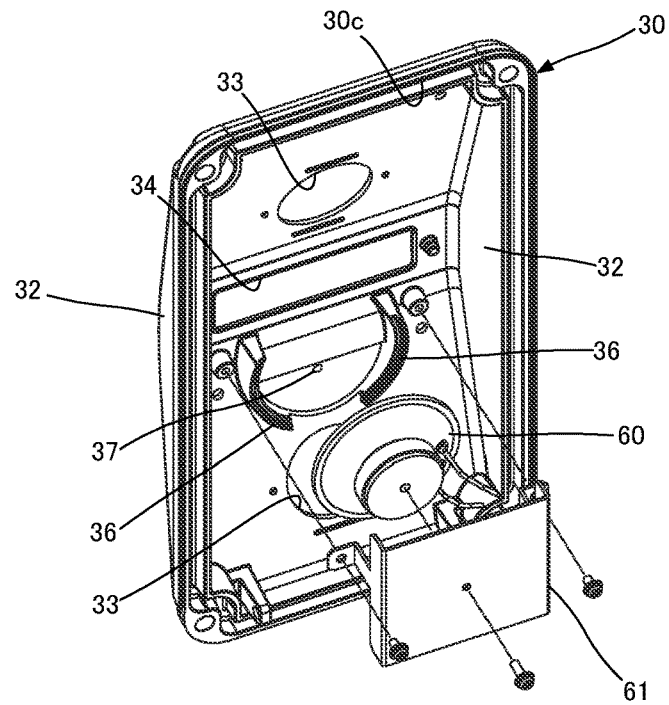
FIG. 13 is an exploded perspective view of a speaker that is to be mounted to the front case of the push-button box according to an embodiment of the present invention.
Figure 14:
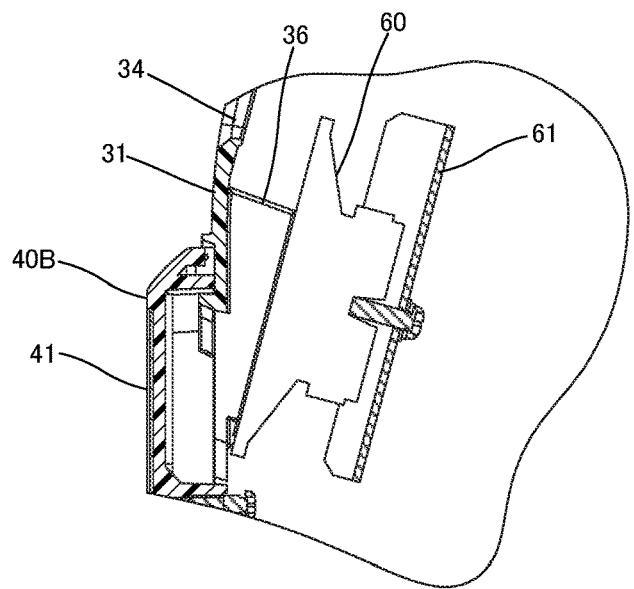
FIG. 14 is an enlarged partially sectional view of the area around the speaker in FIG. 7.
Figure 15:
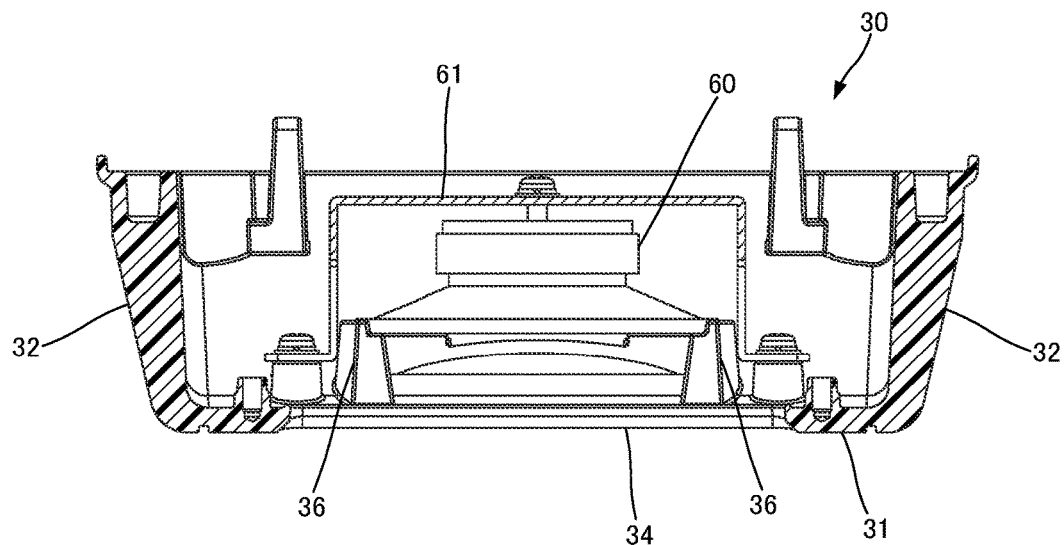
FIG. 15 is a sectional view along the line XV-XV in FIG. 7.
Figure 16:
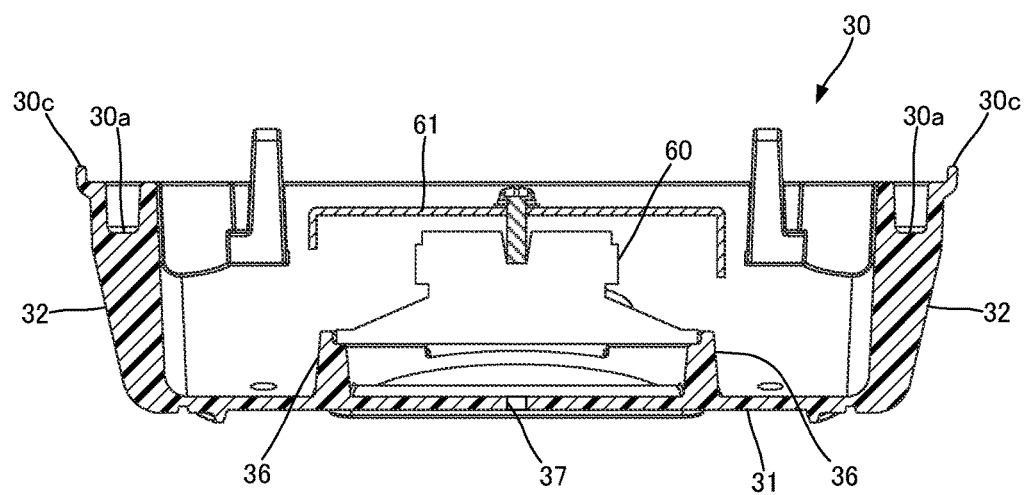
FIG. 16 is a sectional view along the line XVI-XVI in FIG. 7.

In addition, the push-button box 10 has a speaker 60, which outputs a voice about the operation of the pedestrian signal lamp device. In the cabinet 11, such speaker 60 is mounted on the inner face side of the front case 30, being not disposed on the control board, as with the conventional push-button box. In other words, as shown in FIG. 13, in a place where the speaker 60 is to be disposed on the inner face side of the front case 30, a mounting part 36 is provided, and in the state in which the speaker 60 is positioned on the mounting part 36, it is fixed to the mounting part 36 through a plate-like bracket 61, which covers the speaker 60 from the rear face side.

According to such a scheme of mounting the speaker 60, the dead space on the inner face side of the front case 30 can be utilized as a space for disposition, with the mounting operation being facilitated. In addition, in the case where the speaker 60 is to be fixed on the control board through a bracket, it has been difficult to secure the space for disposition, however, by effectively utilizing the above-mentioned dead space, speakers having various sizes and shapes can be mounted.

The rear face of the speaker 60 is covered with a plate-like bracket 61 over the entire area thereof. Therefore, a sufficient sound pressure can be secured without the sound being allowed to leak through a gap between sheet metals to the rear face side (the inside of the cabinet 11) as with such a case where only a part of the speaker 60 on the rear face side thereof is supported with sheet metals in the shape of a letter T. In a place in the front face part 31 where the cone paper is opposed thereto, there is provided a sound-passing small hole 37 for introducing the sound to the outside, however, this small hole 37 is disposed in a place where it is hidden behind the operation panel part 41 of the above-mentioned push button 40B, thereby the possibility that rainwater or the like may get into inside of the cabinet 11 from the small hole 37 being eliminated.

As described above, from the speaker 60, a voice message of "Please wait", which indicates that the push-button box 10 has been brought into an activated state on the basis of the operation of the push button 40, or the like is outputted, and in addition, a prescribed sound or the like telling that the push-button box 10 is for use by a visually handicapped person, or indicating the location of the push-button box 10 is outputted. Such a sound and voice from the speaker 60 are also controlled by a prescribed program in the control board accommodated in the cabinet 11 in addition to the above-mentioned traffic signal controller. Also for the voice information, it is preferably prepared using not only Japanese, but also a plurality of other languages, such as English and Chinese.

By the way, in addition to the functions of voice output by the speaker 60 or display of the above-mentioned display part 50, there are provided a plurality of variations on function that accommodate to such persons as visually handicapped persons, healthy persons, and aged persons as general functions of the push-button box 10, these functions are preferably designed such that they can be implemented with a single control board, and configured such that they can be selected as appropriate by making a switching operation of a switch on the control board. Further, it is preferable that, to the control board, such a function as that which receives a radio wave from a prescribed transmitter possessed by, for example, an aged person or a handicapped person to be automatically operated be added as appropriate.

Heretofore, the embodiment of the present invention has been described with reference to the drawings, however, the specific configuration is not limited to that of the above-described embodiment, and various changes and modifications may be included in the present invention, so long as they do not depart from the spirit and scope thereof. For example, the specific geometries of the entire cabinet 11, the base main body 20, the front case 30 and the like are not limited to the examples as shown in the figures, and various other geometries can be considered. In addition, the number of push buttons 40, the geometries thereof, and the specific types can be subjected to a design alteration as appropriate.

Figure 19:
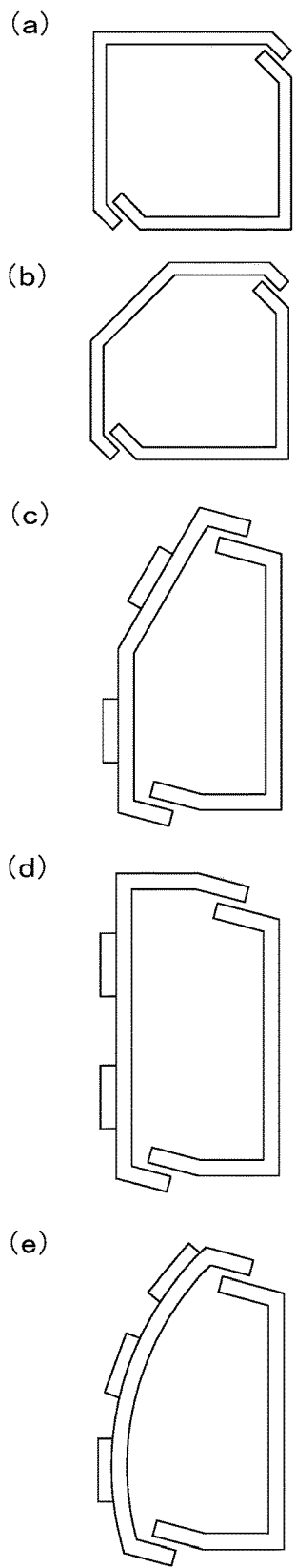
FIG. 19 is an explanatory drawing schematically illustrating variations of the design of the push-button box according to the present invention.

FIG. 19 schematically shows examples of variations of the design of the push-button box 10.

In any of the push-button boxes in FIGS. 19(*a*) to 19(*e*), the rear face of the front case is opened downward in a diagonally rearward direction so as to cover the opening of the base main body from forward. Herein, the inclination angle of the joint of the front case and the base main body, the inclination angle of the top face part of the cabinet, and the number of inclined faces and the inclination angle of the front face part of the front case are not limited in particular, and can be provided with various values. In addition, as shown in FIG. 19(*e*), the inclined face may be formed as a curved face rather than a flat surface, as required.

The push-button box according to the present invention can be used widely as a push-button box that is provided as a piece of ancillary equipment for a pedestrian signal lamp device installed at an intersection or the like of a general road, and is used for instructing an operation (for example, lighting color change) of the pedestrian signal lamp device.

DESCRIPTION OF SYMBOLS

Reference numeral 10 denotes a push-button box; 11 a cabinet; 20 a base main body; 21 a rear face part; 22*a* bottom face part; 23 a top face part; 23*a* a rear slanted face; 24 a side face part; 30 a front case; 30*a* a concave part; 31 a front face part; 31*a* a front slanted face; 31*b* a front vertical face; 32 a side face part; 33 a hole part; 34 an opening part; 35 a frame; 36 a mounting part; 37 a small hole; 40 a push button; 40A a push button; 40B a push button; 41 an operation panel part; 41*a* a pictogram; 42 a packing; 43 a spacer; 43*a* a contact part; 44 a supporting case; 45 a capacitance sensor; 50 a display part; 60 a speaker; and 61 a bracket.

What is claimed is:

1. A push-button box (10) for instructing an operation of a pedestrian signal lamp device, comprising a cabinet (11) that accommodates various components, said cabinet (11) being formed of a base main body (20), which constitutes a rear face of said cabinet (11), being opened on a front face side, and a front case (30), which is combined with the base main body (20) so as to cover an opening of the base main body (20) from forward, being provided with a push button (40), in a state in which said front case (30) covers the opening of said base main body (20) from forward, a rear face of said front case (30) being opened downward in a diagonally rearward direction in said cabinet (11), wherein a joint between an edge at a periphery of the opening of said base main body (20) that extends on a top end side thereof and an edge at a periphery of an opening of said front case (30) that extends on a top end side thereof, covering the edge at the periphery of the opening of said base main body (20) from forward, is disposed on a rear slanted face (23*a*) that is inclined downward in a diagonally rearward direction from a horizontal plane as at least a part of a top face part (23) of said cabinet (11).

2. The push-button box (10) according to claim 1, wherein said front case (30) has a front slanted face (31*a*) that is inclined downward in a diagonally forward direction from a horizontal plane as at least a part of a front face part (31) thereof, and on the front slanted face (31*a*), said push button (40) is disposed.

3. The push-button box (10) according to claim 2, wherein, in the front face part (31) of said front case (30), said front slanted face (31*a*) is formed on an upper half side of the front face part (31), while, on a lower half side of the front face part (31), a front vertical face (31*b*) is formed which is continued to a lower end of said front slanted face (31*a*), being hung down therefrom, on respective outer faces of said front slanted face (31*a*) and said front vertical face (31*b*), said push button (40) being disposed.

4. A push-button box (10) for instructing an operation of a pedestrian signal lamp device, comprising a cabinet (11) that accommodates various components, said cabinet (11) being formed of a base main body (20), which constitutes a rear face of said cabinet (11), being opened on a front face side, and a front case (30), which is combined with the base main body (20) so as to cover an opening of the base main body (20) from forward, being provided with a push button (40), in a state in which said front case (30) covers the opening of said base main body (20) from forward, a rear face of said front case (30) being opened downward in a diagonally rearward direction in said cabinet (11), wherein said push button (40) is provided with an operation panel part (41), which is bulged like a step and spread in parallel with respect to a reference plane in a place where said push button (40) is disposed on an outer face of said front case (30); a spacer (43) made of a metal that is disposed inside of the operation panel part (41); and a capacitance sensor (45), which is disposed inside of said front case (30), being butted against a part of the spacer (43).

5. The push-button box (10) according to claim 1, further comprising a speaker (60), which outputs a voice about the operation of said pedestrian signal lamp device, wherein, in a place where the speaker (60) is to be disposed on an inner face side of said front case (30), a mounting part

(36) is provided, and in a state in which the speaker (60) is positioned on the mounting part (36), the speaker (60) is fixed to the mounting part (36) through a plate-like bracket (61), which covers the speaker (60) from a rear face side.

6. The push-button box (10) according to claim 1, further comprising a display part (50), which displays various pieces of information about the operation of said pedestrian signal lamp device, wherein said display part (50) is capable of giving a display in synchronization with an operation of the push button (40), and is disposed in a vicinity of the push button (40) on an outer face side of said front case (30).

* * * * *